US009723751B2

(12) United States Patent
Doglio (10) Patent No.: US 9,723,751 B2
(45) Date of Patent: Aug. 1, 2017

(54) SYSTEMS AND METHODS FOR VIBRATIONAL ISOLATION OF INFORMATION HANDLING RESOURCES

(71) Applicant: Dell Products L.P., Round Rock, TX (US)

(72) Inventor: Jean Marie Doglio, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 230 days.

(21) Appl. No.: 13/788,651

(22) Filed: Mar. 7, 2013

(65) Prior Publication Data

US 2014/0252197 A1 Sep. 11, 2014

(51) Int. Cl.
*G06F 1/20* (2006.01)
*H05K 5/00* (2006.01)
(Continued)

(52) U.S. Cl.
CPC ......... *H05K 7/20172* (2013.01); *F16F 15/02* (2013.01); *G06F 1/20* (2013.01); *G06F 1/183* (2013.01); *G06F 1/187* (2013.01); *G11B 33/08* (2013.01); *G11B 33/123* (2013.01); *G11B 33/127* (2013.01); *H05K 7/1425* (2013.01); *H05K 7/20736* (2013.01); *Y10T 29/49826* (2015.01)

(58) Field of Classification Search
CPC F16F 15/08; F16F 1/3849; G06F 1/20; G06F 1/183; G06F 1/187; H05K 7/20172; H05K 7/20727; H05K 5/00; H05K 5/0056; H05K 7/14; H05K 7/1404; H05K 7/1427; H05K 7/20736; H05K 7/1425; G11B 33/08; G11B 33/123; G11B 33/127
USPC ............ 415/119, 184, 189; 361/679.48, 695, 361/724, 725, 726, 679.5, 679.6, 690, 361/694; 248/674, 220.22, 300, 560, 581, 248/638; 454/184, 213.1; 312/223.2
See application file for complete search history.

(56) References Cited

U.S. PATENT DOCUMENTS 2,376,484 A * 5/1945 Hendrick ................. B60N 2/38
248/324
2,558,541 A * 6/1951 Cotten ..................... F16M 5/00
248/638
(Continued)

*Primary Examiner* — Brian Mattei
*Assistant Examiner* — Taylor Morris
(74) *Attorney, Agent, or Firm* — Jackson Walker L.L.P.

(57) ABSTRACT

In accordance with embodiments of the present disclosure, a vibrational isolator may include at least one supporting section and at least one attachment member mechanically coupled to the at least one supporting section and configured to mechanically couple to a chassis, such that when disposed in a chassis, the at least one supporting section suspends from the chassis and is configured to support vibration-generating equipment.

In accordance with these and other embodiments of the present disclosure, a method may include forming at least one supporting section and forming at least one attachment member mechanically coupled to the at least one supporting section and configured to mechanically couple to a chassis, such that when disposed in a chassis, the at least one supporting section suspends from the chassis and is configured to support vibration-generating equipment.

14 Claims, 5 Drawing Sheets

(51) Int. Cl.
*H05K 7/20* (2006.01)
*F16F 15/02* (2006.01)
*F16M 1/00* (2006.01)
*F16M 3/00* (2006.01)
*F16M 5/00* (2006.01)
*F16M 7/00* (2006.01)
*F16M 11/00* (2006.01)
*A47B 96/06* (2006.01)
*A47G 29/00* (2006.01)
*A47K 1/00* (2006.01)
*E04G 3/00* (2006.01)
*E04G 5/06* (2006.01)
*F21V 21/00* (2006.01)
*F21V 35/00* (2006.01)
*F16M 13/00* (2006.01)
*A47B 81/00* (2006.01)
*A47B 97/00* (2006.01)
*G11B 33/12* (2006.01)
*G06F 1/18* (2006.01)
*H05K 7/14* (2006.01)
*G11B 33/08* (2006.01)

(56) References Cited

U.S. PATENT DOCUMENTS

| | | | |
|---|---|---|---|
| 5,208,730 A | 5/1993 | Tracy | |
| 5,316,423 A | 5/1994 | Kin | |
| 5,667,206 A * | 9/1997 | Chang | 267/148 |
| 5,969,941 A * | 10/1999 | Cho | 361/679.48 |
| 6,005,768 A * | 12/1999 | Jo | G11B 33/08 248/638 |
| 6,086,476 A * | 7/2000 | Paquin | G06F 1/20 181/225 |
| 6,154,361 A * | 11/2000 | Anderson et al. | 361/679.34 |
| 6,166,901 A * | 12/2000 | Gamble | G06F 1/184 248/560 |
| 6,244,953 B1 * | 6/2001 | Dugan et al. | 454/184 |
| 6,324,731 B1 | 12/2001 | Pliml, Jr. | |
| 6,556,437 B1 * | 4/2003 | Hardin | 361/679.48 |
| 6,639,796 B2 * | 10/2003 | Cannon | 361/695 |
| 7,236,361 B2 * | 6/2007 | Cote | G11B 33/127 165/80.3 |
| 7,315,447 B2 * | 1/2008 | Inoue | G06F 1/184 174/544 |
| 7,874,348 B2 * | 1/2011 | Liu et al. | 165/121 |
| 8,075,248 B2 * | 12/2011 | Yin | H05K 7/20172 248/562 |
| 2004/0091355 A1 * | 5/2004 | Rubenstein | F04D 29/541 415/211.2 |
| 2004/0120114 A1 * | 6/2004 | Feldmeyer | H05K 7/20172 361/695 |
| 2011/0116227 A1 * | 5/2011 | Hsieh et al. | 361/679.54 |
| 2011/0211948 A1 * | 9/2011 | Hsu | 415/213.1 |
| 2014/0306087 A1 * | 10/2014 | Tian | F16M 13/02 248/674 |

* cited by examiner

SYSTEMS AND METHODS FOR VIBRATIONAL ISOLATION OF INFORMATION HANDLING RESOURCES

TECHNICAL FIELD

The present disclosure relates in general to information handling systems, and more particularly vibrational isolation of information handling resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Despite their advantages in cooling information handling resources, air movers generate vibrational energy which can degrade performance of other information handling systems (e.g., hard drives or other electromechanical information handling systems), cause undesirable acoustical noise, and/or present other undesirable effects. Accordingly, vibrational isolators such as grommets are typically used to mechanically isolate air movers from the bays, chasses, and/or other support structures housing the air movers. Such vibrational isolators prevent an air mover from coming into direct contact with such support structures and serve to absorb vibrational energy generated by the air mover, thus limiting the vibrational energy passed from the fan to the support structure.

However, existing vibrational isolators require significant space in the support structures for the air movers. For example, for a typical implementation of a "hot-plug" air mover, grommets may be required on the front and back of the air mover, and structures for accepting such grommets may require up to 10 millimeters of space. As another example, for a cabled air mover in which a carrier and full-structured air mover bay is not required, a grommet-based isolation system may still require up to four millimeters of space.

SUMMARY

In accordance with the teachings of the present disclosure, the disadvantages and problems associated with vibrational isolation of information handling resources may be substantially reduced or eliminated.

In accordance with embodiments of the present disclosure, a vibrational isolator may include at least one supporting section and at least one attachment member mechanically coupled to the at least one supporting section and configured to mechanically couple to a chassis, such that when disposed in a chassis, the at least one supporting section suspends from the chassis and is configured to support vibration-generating equipment.

In accordance with these and other embodiments of the present disclosure, a method may include forming at least one supporting section and forming at least one attachment member mechanically coupled to the at least one supporting section and configured to mechanically couple to a chassis, such that when disposed in a chassis, the at least one supporting section suspends from the chassis and is configured to support vibration-generating equipment.

Technical advantages of the present disclosure will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, busses, computer-readable media, memories, I/O devices and/or interfaces, storage resources, network interfaces, motherboards, integrated circuit packages; electro-mechanical devices (e.g., air movers), displays, and power supplies.

Figure 1:
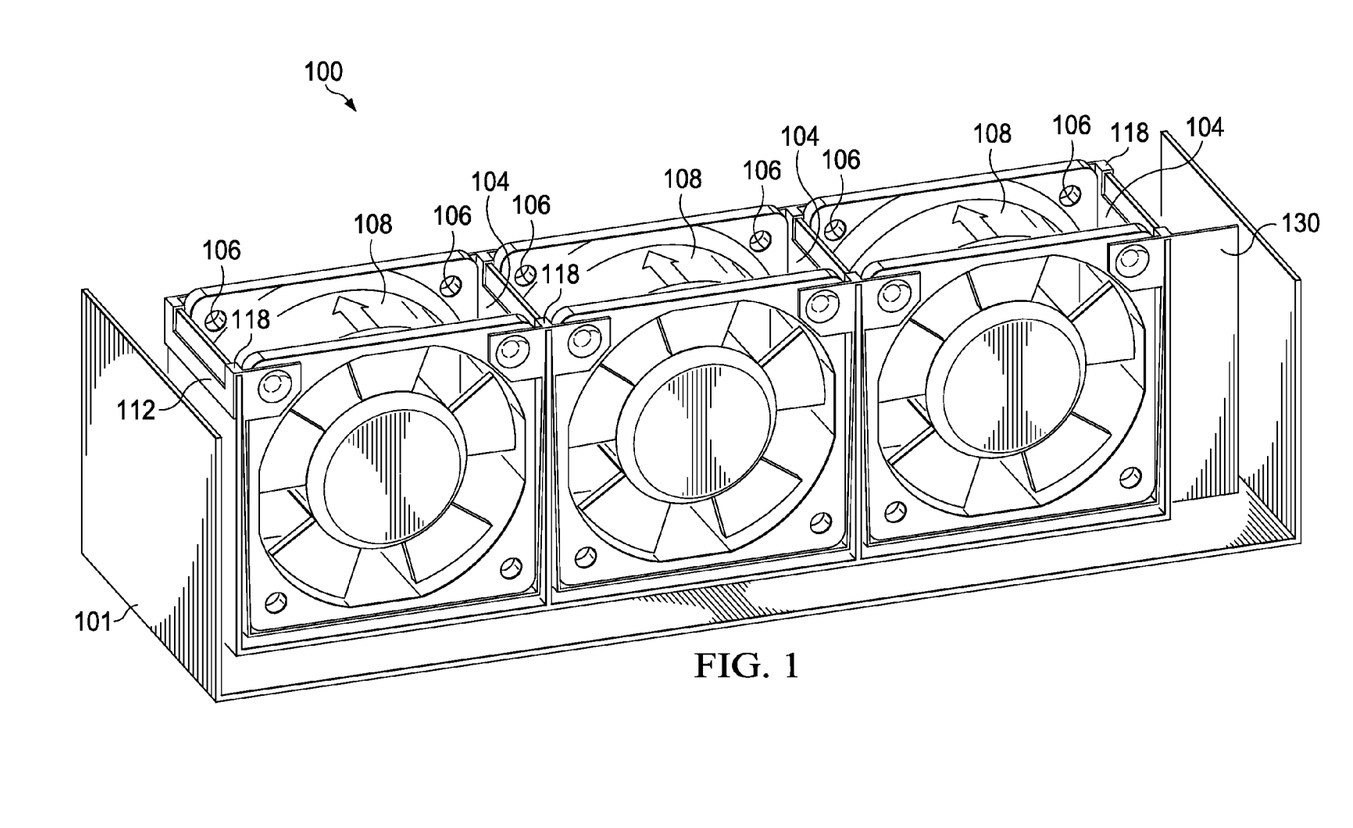
FIG. 1 illustrates a perspective view of selected components of an information handling system, in accordance with the present disclosure.
Figure 2A:
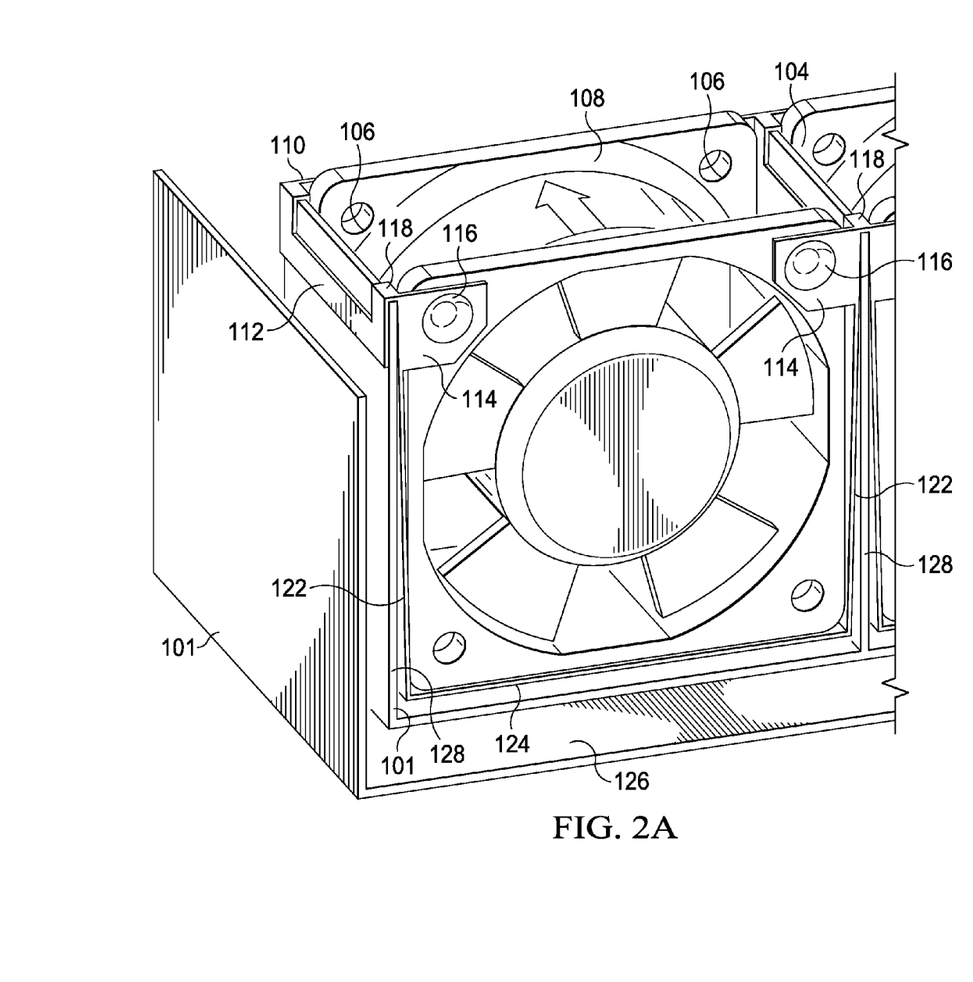
FIG. 2A illustrates a perspective view of an air mover bay housing an air mover supported by a vibrational isolator, in accordance with the present disclosure.
Figure 2B:
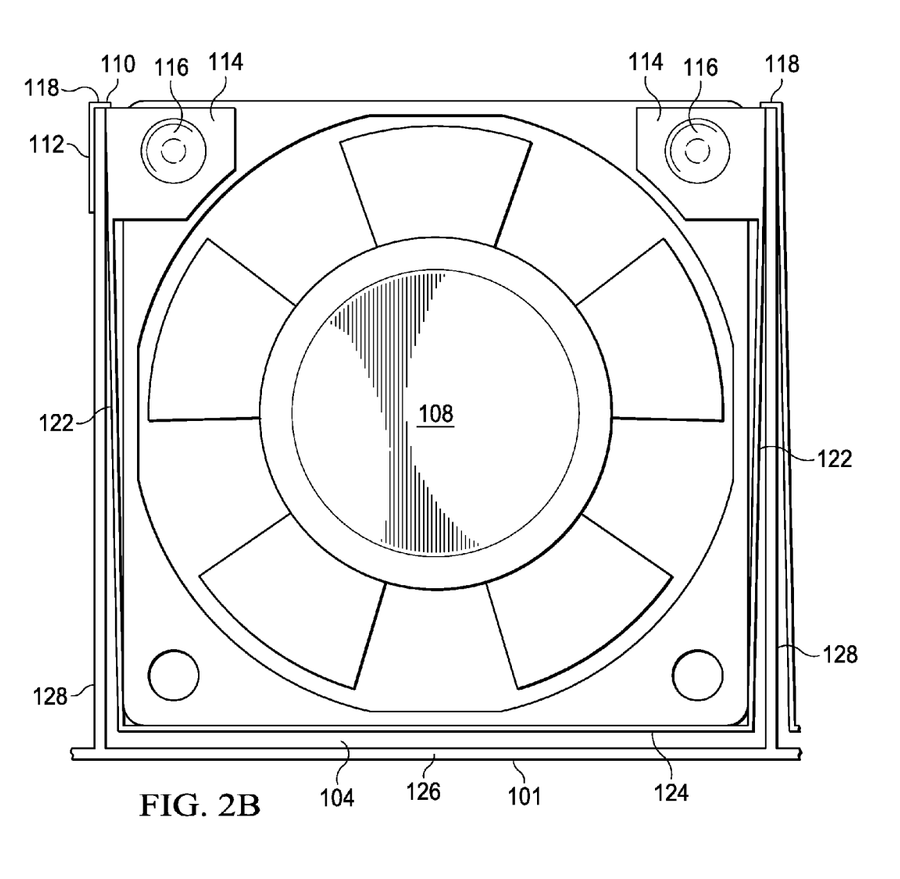
FIG. 2B illustrates an elevation view of an air mover bay housing an air mover supported by a vibrational isolator, in accordance with the present disclosure.

FIG. 1 illustrates a block diagram of selected components of an example information handling system 100, in accordance with the present disclosure. FIG. 2A illustrates a perspective view of an air mover bay 104 of information handling system 100 housing an air mover 108 supported by a vibrational isolator 110, in accordance with the present disclosure. FIG. 2B illustrates an elevation view of air mover bay 104 housing an air mover 108 supported by vibrational isolator 110, in accordance with the present disclosure.

In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data. As shown in FIGS. 1, 2A, and 2B, information handling system 100 may comprise a chassis 101, one or more air mover bays 104 defined by chassis 101, one or more air movers 108 respectively housed in each of the air mover bays 104, and vibrational isolator 110 mechanically coupled to chassis 101 and air movers 108.

Chassis 101 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 101 may be configured to hold and/or provide power to a plurality of information handling systems and/or information handling resources.

As shown in FIGS. 1, 2A, and 2B, information handling system 100 may include one or more bays 104 for housing a respective air mover 108. Each of such bays 104 may be defined by one or more structural elements of chassis 101 (e.g., by substantially planar and substantially parallel bay walls 128 and substantially planar bay floors 126 substantially perpendicular to bay walls 128 and mechanically coupled between corresponding bay walls 128). In addition, although not explicitly shown in the FIGURES, bays 104 may also include electrical connectors or other components allowing components of an air mover 108 housed in a particular bay 104 to electrically couple to a source of electrical energy for powering such air mover 108. A bay 104 may also be configured to allow air movers 108 to be easily inserted and removed from the bay 104 as desired by a user.

In some embodiments, all bays 104 may be configured to receive identical or similar air movers 108 having substantially similar form factors and/or functionality. In other embodiments, some bays 104 may be configured to receive an air mover 108 or an information handling resource different in form factor and/or functionality than that for which another bay 104 is configured.

An air mover 108 may include any mechanical or electro-mechanical system, apparatus, or device operable to move air and/or other gasses. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor. In operation, air mover 108 may cool information handling resources of information handling system 100 by drawing cool air into an enclosure housing the information handling resources from the outside of the chassis, expel warm air from inside the enclosure to the outside of such enclosure, and/or move air across one or more heatsinks (not explicitly shown) internal to the enclosure to cool one or more information handling resources.

Vibrational isolator 110 may comprise a mechanical structure configured to, as described in greater detail below, mechanically couple to chassis 101, support (e.g., via suspension) one or more air movers 108, and provide vibrational isolation between such one or more air movers 108 and chassis 101. Vibrational isolator 110 may be constructed from a material which is thin and flexible relative to chassis 101 or other structure to which vibrational isolator is mounted. In particular embodiments, vibration isolator 110 may comprise material having a spring rate that is no greater than approximately two percent of the chassis 101 material upon which it is mounted. When used to support an air mover 108 or another information handling resource, such material may comprise biaxially-oriented polyethylene terephthalate (commonly known as "boPET" and often referred to by its trade name MYLAR) and/or any other suitable plastic or polymer material. In some embodiments, vibrational isolator 110 may be electrically insulative. In these and other embodiments, vibrational isolator 110 may be treated before use with an antistatic agent to reduce or eliminate electrostatic discharge from vibrational isolator 110.

Figure 3:
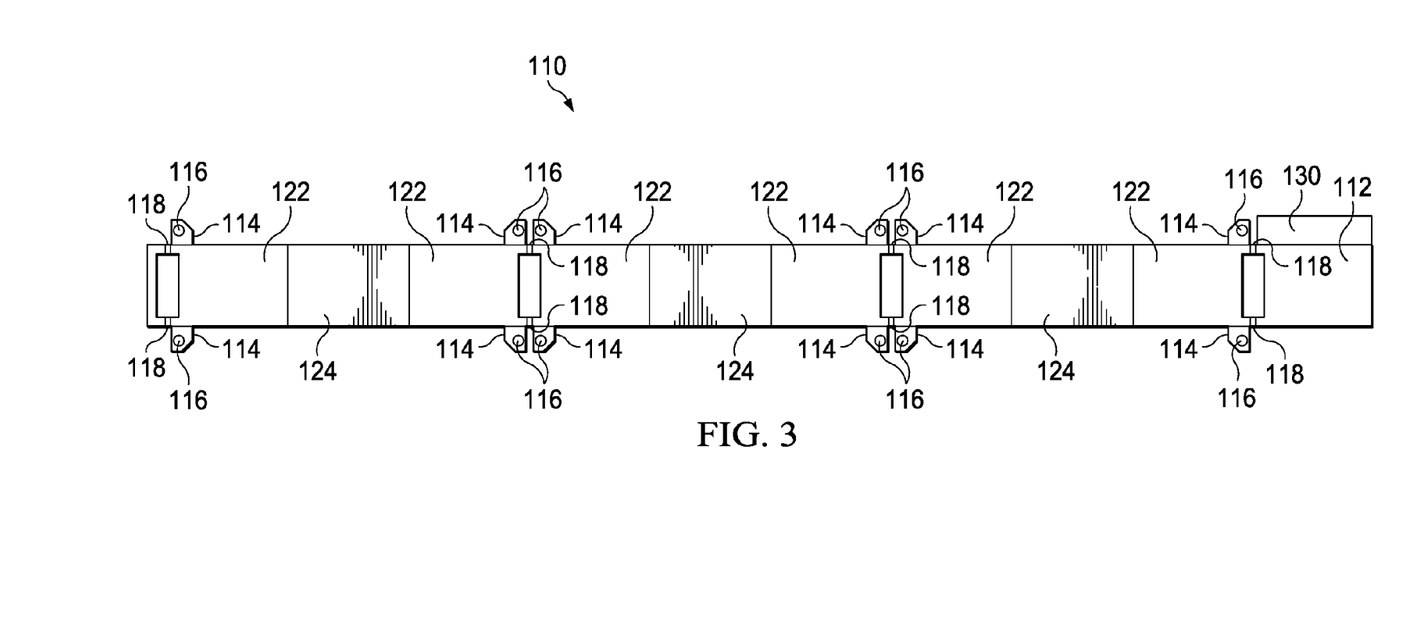
FIG. 3 illustrates a plan view of an example vibrational isolator prior to being formed into shape, in accordance with the present disclosure.
Figure 4:
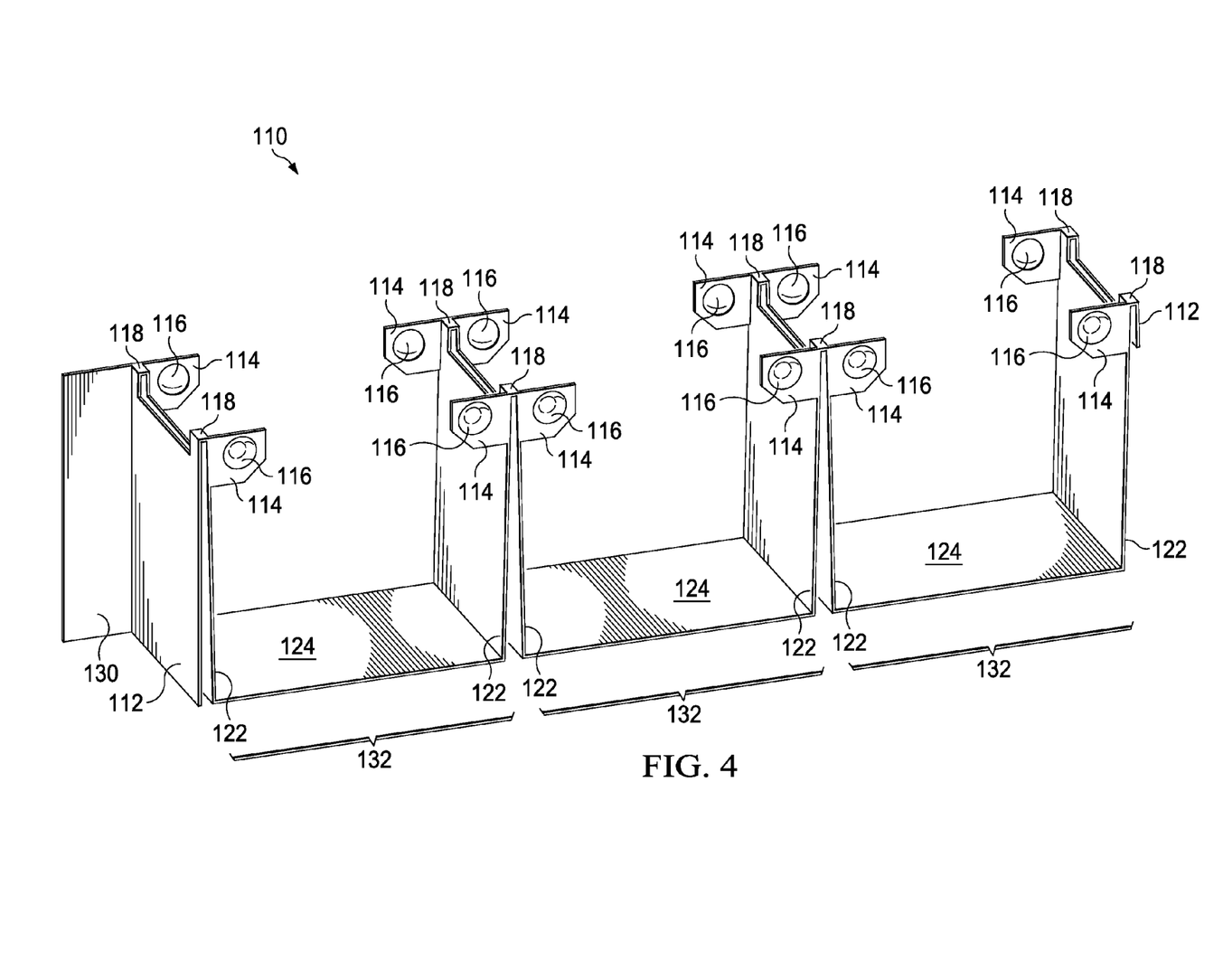
FIG. 4 illustrates a perspective view of an example vibrational isolator after being formed into shape, in accordance with the present disclosure.

In addition to FIGS. 1, 2A, and 2B, illustrative details of an example vibrational isolator 110 are depicted in FIGS. 3 and 4. FIG. 3 illustrates a plan view of an example vibrational isolator 110 prior to being formed into shape for use in information handling system 100, in accordance with the present disclosure. FIG. 4 illustrates a perspective view of an example vibrational isolator 110 after being formed into shape for use in information handling system 100, in accordance with the present disclosure.

As shown in FIGS. 1-4, vibrational isolator 110 may be formed to include one or more chassis attachment members 112, a plurality of top portions 118, a plurality of sides 122, one or more bottom portions 124, one or more air mover attachment members 114, one or more embosses 116 (e.g., wherein each emboss 116 is formed in a respective air mover attachment member 114), and one or more baffles 130.

A chassis attachment member 112 may include a portion of vibrational isolator 110 configured to mechanically couple to a corresponding structure of chassis 101 (e.g., a bay wall 128) via an adhesive and/or appropriate fasteners (e.g., screws, bolts, etc.). Such coupling of vibrational isolator 110 to chassis 101 via a chassis attachment member 112 may server to maintain vibrational isolator 110 in place relative to chassis 101. In some embodiments, such chassis attachment members 112 may be formed on opposite ends of vibrational isolator 110. In such embodiments, chassis attachment members 112 may be formed adjacent to a corresponding top portion 118.

A top portion 118 may be configured to mechanically rest on a portion of chassis 101 (e.g., on top of a bay wall 128) and may serve to, together with another top portion 118 located opposite thereto within a bay 104, mechanically suspend other portions of vibrational isolator 110 (e.g., sides 122, bottom portions 124, air mover attachment members 114) within such bay 104.

A side 122 may be formed adjacent to and may be configured to suspend from a corresponding top portion 118. In some embodiments, sides 122 may be formed when installed in chassis 101, such that each side 122 angles away from the chassis 101 component (e.g., bay wall 128) from which it is suspended as such side 122 runs from a corresponding top 118 to a corresponding bottom portion 124. Such shape may ensure greater isolation between chassis 101 components (e.g., bay walls 128) and an air mover 108 suspended between two opposite sides 122.

A bottom 124 may be formed between and configured to suspend from two sides 122 and, in concert with such two sides 122, may be configured to support an air mover 108. In some embodiments, bottom 124 may be formed with dimensions (e.g., a depth and width) corresponding to dimensions of an air mover 108 for which vibrational isolator 110 is intended to support.

An air mover attachment member 114 may comprise a projection of vibrational isolator 110 (e.g., a projection from and substantially perpendicular to a corresponding side 122) having an emboss 116 formed thereon. Emboss 116 may be formed such that it is configured to engage with a corresponding mounting structure (e.g., opening 106) of air mover 108, such that when one or more embosses 116 are engaged with one or more respective corresponding mounting structures of an air mover 108, such one or more embosses 116 limit or eliminate movement of such air mover 108 relative to vibrational isolator 110 and/or may ensure mechanical isolation between air mover 108 and/or chassis 101.

A baffle 130 may be formed adjacent to a corresponding chassis attachment member 112 and may be configured to, when installed in chassis 101, direct circulation of air (e.g., prevent recirculation of air through air movers 108).

As shown in FIG. 3, the various portions of vibrational isolator 110 may be formed from a single item or sheet of material. During manufacture of vibrational isolator 110, the various portions (e.g., chassis attachment members 112, top portions 118, sides 122, bottom portions 124, air mover attachment members 114, and/or baffles 130) may be defined by creating living hinges, creases, and/or perforations between adjacent portions. Such living hinges, creases, and/or perforations may then allow for vibrational isolator 110 to be bent or otherwise formed into shape so that it may be installed in chassis 101.

As shown in FIG. 4, the various portions of vibrational isolator 110 may define one or more air-mover supporting sections 132, wherein each air-mover supporting section 132 is configured to, when installed in chassis 101, support a corresponding air mover 108. Although FIGS. 1, 3, and 4 depict a vibrational isolator 110 defining three air-mover supporting sections 132, a vibrational isolator 110 may be formed so as to define any number (e.g., one or more) of air-mover supporting sections 132.

Although the FIGURES depict supporting sections 132 as each having discernible sides 122 and bottom portions 124, in some embodiments of the present disclosure, a supporting section 132 may not include any discernible segments, but may simply suspend from chassis attachment members 112 and support an air mover 108, other information handling resource, or other vibration-generating equipment.

In addition to chassis 101, air mover bays 104, air movers 108, and vibrational isolator 110, information handling system 100 may include one or more other information handling resources and components.

As may be readily seen in FIG. 2B, vibrational isolator 110 may be configured to support an air mover 108 within chassis 101 (e.g., within a bay 104) while preventing air mover 108 from coming into contact with components of chassis 101 (e.g., bay walls 124 and/or bay floor 126), thus providing mechanical isolation between air mover 108 and chassis 101. Such mechanical isolation may reduce or limit the transfer of vibrational energy from air mover 108 to chassis 101.

Although FIGS. 1-4 and the discussion above contemplate particular embodiments, the present disclosure shall not be limited to such embodiments. For example, although example information handling system 100 has been described as comprising a chassis 101 including a plurality of bays 104 for receiving air movers 108, any information handling system 100 having any suitable mechanical structure for mechanically supporting information handling resources is considered to be within the scope of the present disclosure.

As another example, although the discussion above has contemplated the use of vibrational isolator 110 to mechanically isolate an air mover 108 from chassis 101, vibrational isolator 110 and/or a vibrational isolator similar thereto may be used to mechanically isolate any information handling resource or any other vibration-generating equipment from chassis 101.

Although the present disclosure has been described in detail, it should be understood that various changes, substitutions, and alterations can be made hereto without departing from the spirit and the scope of the disclosure as defined by the appended claims.

What is claimed is:

1. A vibrational isolator comprising:
 a first top surface configured to rest on an upper edge of a first bay wall of an information handling system chassis;
 a second top surface configured to rest on an upper edge of a second bay wall of the chassis, the first bay wall and the second bay wall defining a first bay therebetween; and
 a suspended portion, comprising:
  a first sidewall hanging downward from the first top surface into the first bay, sloping away from the first bay wall and terminating at a lower edge vertically displaced above a base of the first bay;
  a second sidewall hanging downward from the second top surface into the first bay, sloping away from the second bay wall and terminating at a lower edge vertically displaced above the base of the first bay; and
  a bottom surface, vertically displaced above the base of the first bay, extending between the lower edge of the first sidewall and the lower edge of the second sidewall;
 wherein, when the first and second top surfaces are resting on the upper edges of the first and second bay walls, a weight of the suspended portion is transmitted to the upper edges of the first and second bay walls via the first and second top surfaces.

2. The vibrational isolator of claim 1, wherein the first and second top surfaces and the suspended portion comprises different portions of a single sheet of a particular material.

3. The vibrational isolator of claim 2, wherein the particular material is biaxially-oriented polyethylene terephthalate.

4. The vibrational isolator of claim 1, further comprising an equipment attachment flange mechanically coupled to the suspended portion, the equipment attachment flange configured to mechanically couple to a mounting structure of vibration-generating equipment resting on the bottom surface.

5. The vibrational isolator of claim 4, the mounting structure comprising an opening in the vibration-generating equipment and the equipment attachment flange includes an emboss configured to engage with the opening to mechanically couple the equipment attachment member to the vibration-generating equipment.

6. The vibrational isolator of claim 4, wherein the vibration-generating equipment comprises an air mover of an information handling system.

7. The vibrational isolator of claim 1, wherein the first and second top surfaces and the suspending comprise a vibrational isolation element and wherein the vibrational isolator comprises a plurality of adjacent vibrational isolation elements, each vibrational isolation element configured to be received within a corresponding bay of the chassis.

8. An information handling system comprising:
 a processor;
 a non-transitory computer readable medium;
 a chassis including a plurality of bay walls defining a plurality of bays; and
 a vibrational isolator comprising a plurality of vibrational isolation elements, each received within one of the plurality of bays, wherein each of the vibrational isolation elements includes:
  a first top surface configured to rest on an upper edge of a first bay wall of a chassis;
  a second top surface configured to rest on an upper edge of a second bay wall of the chassis, the first bay wall and the second bay wall defining a first bay therebetween;
  a suspended portion, comprising:
   a first sidewall configured to hang downward from the first top surface into the first bay, sloping away from the first bay wall and terminating at a lower edge vertically displaced above a base of the first bay;
   a second sidewall configured to hand hanging downward from the first top surface into the first bay, sloping away from the second bay wall and terminating at a lower edge vertically displaced above the base of the first bay; and
   a bottom surface extending between the lower edge of the first sidewall and the lower edge of the second sidewall;
  wherein, when the first and second top surfaces are resting on upper edges of first and second bay walls, the bottom surface is suspended within the first bay, vertically displaced above a base of the first base, and a weight of the entire suspended portion is transmitted to the upper edges of the first and second bay walls via the first and second top surfaces.

9. The information handling system of claim 8, wherein the first and second top surfaces and the suspended portion comprises different portions of a single sheet of a particular material.

10. The information handling system of claim 9, wherein the particular material is biaxially-oriented polyethylene terephthalate.

11. The information handling system of claim 8, further comprising an equipment attachment flange mechanically coupled to the suspended portion, the equipment attachment flange configured to mechanically couple to a mounting structure of vibration-generating equipment resting on the bottom surface.

12. The information handling system of claim 11, the mounting structure comprising an opening in the vibration-generating equipment and the equipment attachment flange includes an emboss configured to engage with the opening to mechanically couple the equipment attachment member to the vibration-generating equipment.

13. The information handling system of claim 11, wherein the vibration-generating equipment comprises an air mover of an information handling system.

14. The information handling system of claim 8, wherein each vibrational isolation element defines is configured to receive a corresponding air mover and wherein the information handling system includes the air movers.

* * * * *

UNITED STATES PATENT AND TRADEMARK OFFICE
CERTIFICATE OF CORRECTION

PATENT NO. : 9,723,751 B2
APPLICATION NO. : 13/788651
DATED : August 1, 2017
INVENTOR(S) : Doglio Page 1 of 2

It is certified that error appears in the above-identified patent and that said Letters Patent is hereby corrected as shown below:

In the Claims

Please amend Claim 2 as follows:
2. The vibrational isolator of Claim 1, wherein the first and second top surfaces and the suspended portion comprise different portions of a single sheet of a particular material.

Please amend Claim 5 as follows:
5. The vibrational isolator of Claim 4, the mounting structure comprising an opening in the vibration-generating equipment and the equipment attachment flange including an emboss configured to engage with the opening to mechanically couple the equipment attachment member to the vibration-generating equipment.

Please amend Claim 7 as follows:
7. The vibrational isolator of Claim 1, wherein the first and second top surfaces and the suspended portion comprise a vibrational isolation element and wherein the vibrational isolator comprises a plurality of adjacent vibrational isolation elements, each vibrational isolation element configured to be received within a corresponding bay of the chassis.

Please amend Claim 8 as follows:
8. An information handling system comprising:
 a processor;
 a non-transitory computer readable medium;
 a chassis including a plurality of bay walls defining a plurality of bays; and
 a vibrational isolator comprising a plurality of vibrational isolation elements, each received within one of the plurality of bays, wherein each of the vibrational isolation elements includes:
 a first top surface configured to rest on an upper edge of a first bay wall of a chassis;
 a second top surface configured to rest on an upper edge of a second bay wall of the chassis, the first bay wall and the second bay wall defining a first bay therebetween;

Signed and Sealed this
Tenth Day of October, 2017

Joseph Matal
*Performing the Functions and Duties of the*
*Under Secretary of Commerce for Intellectual Property and*
*Director of the United States Patent and Trademark Office* a suspended portion, comprising:

a first sidewall configured to hang downward from the first top surface into the first bay, sloping away from the first bay wall and terminating at a lower edge vertically displaced above a base of the first bay;

a second sidewall configured to hang downward from the first top surface into the first bay, sloping away from the second bay wall and terminating at a lower edge vertically displaced above the base of the first bay; and a bottom surface extending between the lower edge of the first sidewall and the lower edge of the second sidewall;

wherein, when the first and second top surfaces are resting on upper edges of first and second bay walls, the bottom surface is suspended within the first bay, vertically displaced above a base of the first base, and a weight of the entire suspended portion is transmitted to the upper edges of the first and second bay walls via the first and second top surfaces.

Please amend Claim 9 as follows:
9. The information handling system of Claim 8, wherein the first and second top surfaces and the suspended portion comprise different portions of a single sheet of a particular material.

Please amend Claim 12 as follows:
12. The information handling system of Claim 11, the mounting structure comprising an opening in the vibration-generating equipment and the equipment attachment flange including an emboss configured to engage with the opening to mechanically couple the equipment attachment member to the vibration-generating equipment.

Please amend Claim 14 as follows:
14. The information handling system of Claim 8, wherein each vibrational isolation element is configured to receive a corresponding air mover and wherein the information handling system includes the air movers.